United States Patent [19]
Bayer

[11] 3,874,443

[45] Apr. 1, 1975

[54] HEAT DISSIPATOR

[76] Inventor: Joseph V. Bayer, 2214 Monterrey Dr., Kemah, Tex. 77565

[22] Filed: July 16, 1973

[21] Appl. No.: 379,343

[52] U.S. Cl. .................... 165/47, 165/80, 165/185, 174/15, 269/254 R, 81/417

[51] Int. Cl. .................... F24h 3/00

[58] Field of Search ...... 165/47, 80, 185; 174/15 R, 174/DIG. 5; 228/46; 81/417; 269/254 CS, 254 MW, 254 DF, 254 D, 254 R

[56] References Cited

UNITED STATES PATENTS

| | | | |
|---|---|---|---|
| 3,552,630 | 1/1971 | Dean | 228/46 |
| 3,566,958 | 3/1971 | Zelina | 174/DIG. 5 |
| 3,652,903 | 3/1972 | Eriksson | 165/80 |

*Primary Examiner*—Charles Sukalo
*Attorney, Agent, or Firm*—Torres & Berryhill

[57] ABSTRACT

Disclosed is a heat dissipator for use in soldering or desoldering dual-inline-pin integrated circuits comprising two identical heat dissipation clip members each having a notch forming a jaw. The clip members are pivotably fastened together and biased by a spring such that the jaw clamps over the integrated circuit when in use.

In an alternate embodiment, the heat dissipator may be modified to function as an extractor for removing or inserting an integrated circuit on a printed circuit board, as well as functioning as a heat sink. The modified embodiment includes an adaptor member attached to each clip member having a plurality of fingers to engage the integrated circuit.

8 Claims, 6 Drawing Figures

HEAT DISSIPATOR

BACKGROUND OF THE INVENTION

1. Field of the Invention

The present invention relates to heat dissipators for electronic components, and in a more specific application to a heat dissipator employed while soldering and desoldering integrated circuits.

2. Brief Description of the Prior Art

It is recognized that excessive heat can increase the probability of failure of electronic components. Such heat can either be generated by the component or applied to the component by external means. Therefore, in order to prevent failure of the components it is necessary to provide a means for dissipating heat rapidly.

The prior art reveals several devices employed for dissipating heat. U.S. Pat. Nos. 3,305,004 — Barlowe; 3,572,428 — Monaco; and 3,670,215-Wilkens et al disclose devices employed to dissipate heat generated by the components, such as power transistors and integrated circuits. Since these devices are designed to dissipate heat generated by the component, they are not capable of rapidly dissipating large amounts of heat, such as heat applied by a soldering iron when the component is being placed on or removed from a printed circuit board.

Prior art devices relating to heat dissipators for soldering and desoldering are disclosed in U. S. Pat. Nos. 3,291,476 — Calkin and 3,552,630 — Dean. In the U. S. Pat. No. 3,552,630, a device is disclosed that is capable of holding and heat sinking a plurality of electrical leads. However, the device, as illustrated, is used to hold an electrical connector having a plurality of leads and cannot be used for heat sinking integrated circuits when they are on printed circuit boards, due to the bulkiness of the device. The U.S. Pat. to Calkins (3,291,476) discloses a soldering tool for individual conductors. The purpose of the tool is to prevent the breakdown of insulation caused by solder moving up the conductor. It is, therefore, necessary to have a tool for each size of electrical conductor used. A tool having recesses for 30 ga. wire would not be suitable when used on 18 ga. wire. When soldering or desoldering an integrated circuit on a printed circuit board, it is necessary for every conductor to be heat sinked to prevent heat damage. Therefore, the soldering tool disclosed is not suitable for a device having a plurality of leads.

SUMMARY OF THE INVENTION

The present invention provides a heat sink employed for soldering and desoldering dual-inline-pin (DIP) integrated circuits, comprising two identical heat dissipating clip members pivotally hinged, each member having notches thereon cooperating to form a jaw for engaging an integrated circuit. The heat sink is biased in a gripping relationship with the integrated circuit by a spring positioned in a recess in each member.

The heat sink simultaneously engages the integrated circuit and dissipates heat applied to the integrated circuit leads by the soldering iron. It should be appreciated that the heat sink of the present invention is fabricated from a suitable material capable of dissipating heat rapidly. In one form, it may be fabricated from aluminum. A means that may be employed to increase the dissipating efficiency of the material used in the heat sink is to increase the surface area by providing vertical ribs or fins on each member.

In a modified form of the heat sink, an attachment or puller adaptor is provided, allowing the heat sink to be converted to a tool for inserting and removing integrated circuits on printed circuit boards, as well as being used as a heat sink. Each adaptor is provided with connector means in the form of a protruding dovetail to be received by a dovetail groove on each member. A plurality of fingers are formed on each adaptor to engage the integrated circuit.

The present invention provides a small and easy to use heat sink for soldering and desoldering. The simplicity of its design provides a heat sink capable of dissipating large amounts of heat rapidly, yet making it inexpensive to manufacture.

It should be appreciated that the heat sink may be constructed for and employed on various sizes and types of dual-inline-pin integrated circuits and is not limited to the typical 14 or 16 DIP integrated circuits.

Other features, objects and advantages of the present invention will become more readily apparent from the accompanying drawings and specification which follow.

DESCRIPTION OF THE PREFERRED EMBODIMENTS

Figure 1:
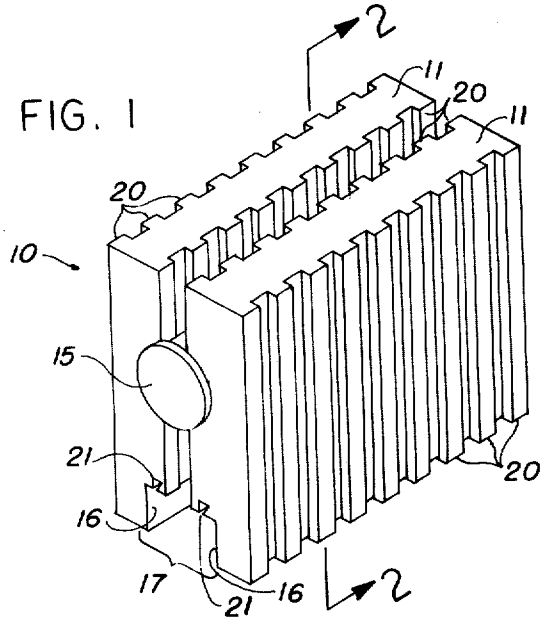
FIG. 1 is a perspective view of the integrated circuit heat sink of the present invention.
Figure 2:
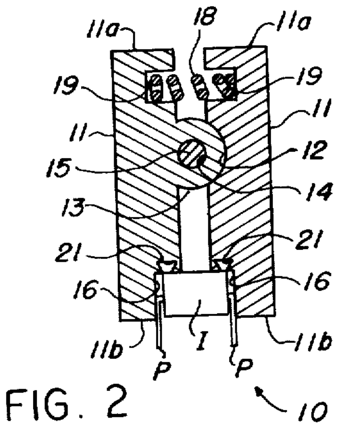
FIG. 2 is a cross sectional view of the heat sink of the present invention, taken along line 2—2 of FIG. 1.
Figure 3:
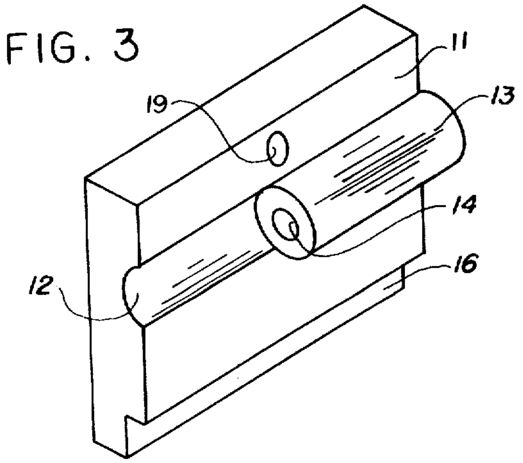
FIGS. 3 is a perspective view of an individual clip member of the heat sink of FIG. 1.

Referring to the drawings and more specifically to FIGS. 1 and 2, the integrated circuit heat sink of the present invention is indicated generally at 10. The heat sink 10 comprises two identical heat dissipating clip members 11 pivotally secured by a suitable hinging means. As best illustrated in FIG. 3, the hinging means is provided by a semicylindrical depression 12 adjacent a semicylindrical protrusion 13 having a bore 14 for insertion of a pin 15 which is held in place by a clip **15*a* (FIG. 5) or other suitable fastening means. The depression 12 of one member 11 engages the protrusion 13 of the opposing member forming a hinge-like fastener. It should be appreciated that any other suitable means may be employed for providing pivotal movement between the two members 11**.

Each member 11 is provided with a recess or notch 16 located along the lower interior edge thereof, which forms a jaw 17 to clamp over an integrated circuit I. The jaw 17 conforms generally to the cross-section of integrated circuit I and may contact the top and sides of the integrated circuit I. The sides of the jaw 17 contact each of the pins P of the integrated circuit I, assuring good heat conductance.

Biasing means in the form of a coil spring 18 may be employed to maintain the heat sink 10 in clamping relationship with the integrated circuit I. The spring 18 is positioned in cylindrical depressions 19 provided in each member 11. Of course, other biasing means may be used.

To increase the heat dissipating characteristics of the heat sink 10, vertical fins 20 may be provided on the interior and exterior surfaces of each member 11, increasing the total surface area. The clip members 11 are also preferably constructed of a material, such as aluminum, which is a good heat conductor.

The upper and lower ends 11a, 11b, respectively, of the clip members are preferably flat. Thus, they may also serve as support members during soldering operations by simply turning the circuit board, to which the integrated circuit is attached, so that the heat sink is upside down. This keeps the circuit board or chassis from lying directly on the working surface.

Figure 5:
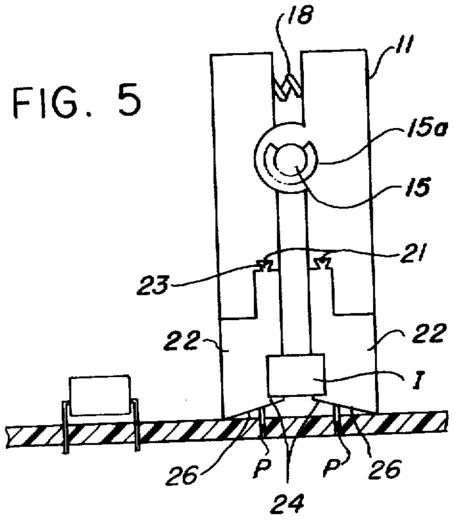
FIG. 5 is an end elevational view of the heat sink of the present invention employing the adaptor of FIG. 4.
Figure 4:
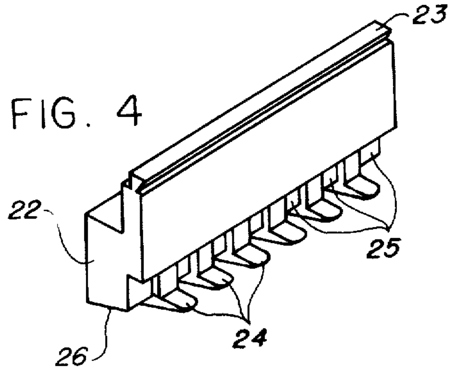
FIG. 4 is a perspective view of the puller adaptor employed with the heat sink of the present invention.
Figure 6:
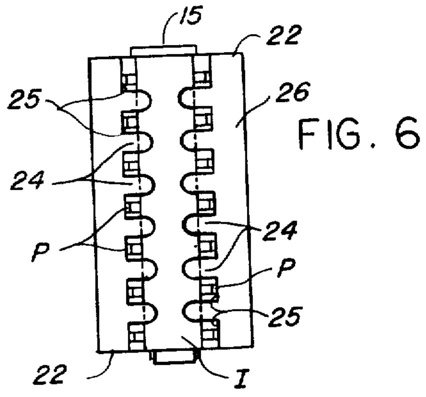
FIG. 6 is a bottom view of the heat sink of FIG. 5 engaging an integrated circuit.

Referring now to FIGS. 4–6, a modified form of the heat sink 10 is illustrated having a dovetail groove 21 provided for attachment of an accessory or pulling adaptor 22. The pulling adaptor 22 is best illustrated in FIG. 4 as comprising a dovetail 23 for engaging groove 21. The adaptor 22 can be employed for inserting and removing integrated circuits from printed circuit boards. A plurality of fingers 24 are provided on each adaptor 22 to engage the integrated circuit I. The fingers 24 are evenly spaced and may have a recessed area 25 between them. The recessed areas 25 are provided for maintaining maximum heat sink-to-integrated circuit contact. It should also be appreciated that the bottom 26 of each adaptor 22 is beveled providing a wedging effect between the board and integrated circuit I as the fingers 24 engage the integrated circuit. This wedging effect will help to remove integrated circuits from the board as illustrated in FIG. 5.

While two embodiments have been described, it should be appreciated that the heat sink may take on various forms, shapes and sizes. While one embodiment discloses a heat sink having fins 20 it is not required that each member 11 be provided with them. It should also be noted that the adaptor 22 may be provided with fins to increase the surface area, and that recesses, similar to recesses 25 in the adaptor 22, may be provided in the notch 16 of each clip member 11. While the heat sink of the illustrated embodiment is shown employed on a DIP integrated circuit having 14 leads, it should be appreciated that it may be constructed for employment with other types of DIP integrated circuits, including those of fewer or greater leads.

The foregoing disclosure and description of the invention is illustrative and explanatory thereof, and various changes in the size, shape and materials as well as in the details of the illustrated construction may be made within the scope of the appended claims without departing from the spirit of the invention.

I claim:

1. A heat sink for dissipating heat from integrated circuits during soldering and desoldering operations comprising: a pair of clip members pivotally connected by hinging means, each of said clip members having a notch along the lower interior edge thereof to form cooperably a jaw engageable with the sides and top of a DIP (Dual-Inline-Pins) integrated circuit; and biasing means between said clip members biasing said jaw into gripping engagement with said DIP integrated circuit.

2. A heat sink as set forth in claim 1 in which each of said clip members is provided with a plurality of fins along the sides thereof to increase the surface area of said heat sink.

3. A heat sink for dissipating heat from integrated circuits during soldering and desoldering operations comprising: a pair of hingedly connected clip members each having a notch along the lower interior edge thereof to form a jaw capable of engagement with the sides and top of a DIP (Dual-Inline-Pins) integrated circuit; biasing means between said clip members for biasing said jaw toward gripping engagement with said DIP integrated circuit; and a pulling adaptor removably connected to each of said clip members and comprising notches along the lower interior edges thereof to form a second jaw engageable with the sides of said DIP integrated circuit, said pulling adaptors also including fingers means projecting laterally from the lower edges thereof for disposition between the pins of said DIP integrated circuit and for engagement with the bottom of said DIP integrated circuit.

4. A heat sink as set forth in claim 3 in which said adaptors are provided with vertical recesses between said finger means in which said DIP integrated circuit pins may be disposed to provide greater contact area between said adaptors and said DIP integrated circuit.

5. A heat sink as set forth in claim 3 in which the lower edge of each of said adaptors is beveled inwardly and upwardly to provide wedge means by which wedging may be effected, between said DIP integrated circuit and a circuit board to which it is attached, by movement of said adaptors toward each other.

6. A heat sink as set forth in claim 3 in which said adaptors are connected to said clip members by cooperating dovetail connections within said first mentioned jaw.

7. A heat sink for dissipating heat from integrated circuits during soldering and desoldering operations comprising: a pair of hingedly connected clip members, said clip members cooperating to form a jaw engageable with the sides and top of a DIP (Dual-Inline-Pins) integrated circuit; biasing means between said clip members biasing said jaw into gripping engagement with said DIP integrated circuit; and finger means projecting laterally from the lower edges of said clip members for disposition between the pins of said DIP integrated circuit and for engagement with the bottom of said DIP integrated circuit, vertical recesses being provided between said finger means in which said DIP integrated circuit pins may be disposed to provide greater contact area between said heat sink and said DIP integrated circuit.

8. A heat sink as set forth in claim 7 in which each of said clip members is provided with a plurality of fins along the sides thereof to increase the surface area of said heat sink.

* * * * *